(12) United States Patent
Akasaka et al.

(10) Patent No.: US 11,189,986 B2
(45) Date of Patent: Nov. 30, 2021

(54) LOW-NOISE RAMAN AMPLIFIER

(71) Applicant: Fujitsu Limited, Kawasaki (JP)

(72) Inventors: Youichi Akasaka, Plano, TX (US); Daniel Bihon, Allen, TX (US); Tadashi Ikeuchi, Plano, TX (US)

(73) Assignee: Fujitsu Limited, Kawasaki (JP)

( * ) Notice: Subject to any disclaimer, the term of this patent is extended or adjusted under 35 U.S.C. 154(b) by 558 days.

(21) Appl. No.: 16/139,136

(22) Filed: Sep. 24, 2018

(65) Prior Publication Data

US 2020/0099193 A1    Mar. 26, 2020

(51) Int. Cl.
| | | |
|---|---|---|
| *H01S 3/30* | (2006.01) | |
| *H01S 3/08* | (2006.01) | |
| *H01S 3/094* | (2006.01) | |
| *H01S 3/067* | (2006.01) | |
| *H01S 3/23* | (2006.01) | |
| *H01S 3/131* | (2006.01) | |
| *H04B 10/2513* | (2013.01) | |

(52) U.S. Cl.
CPC .......... *H01S 3/302* (2013.01); *H01S 3/06762* (2013.01); *H01S 3/06775* (2013.01); *H01S 3/08027* (2013.01); *H01S 3/094003* (2013.01); *H01S 3/1317* (2013.01); *H01S 3/2316* (2013.01); *H04B 10/2513* (2013.01)

(58) Field of Classification Search
None
See application file for complete search history.

(56) References Cited

U.S. PATENT DOCUMENTS

| | | | | |
|---|---|---|---|---|
| 2001/0036004 | A1* | 11/2001 | Ackerman | H04B 10/2916 359/334 |
| 2002/0159131 | A1* | 10/2002 | Bartolini | H01S 3/06758 359/334 |
| 2003/0117692 | A1* | 6/2003 | Tanaka | H04B 10/071 359/334 |
| 2005/0195471 | A1* | 9/2005 | Trutna, Jr. | H01S 3/302 359/327 |
| 2005/0265647 | A1* | 12/2005 | Vakhshoori | G02B 6/4215 385/4 |
| 2013/0121693 | A1* | 5/2013 | Tanaka | H04B 10/2916 398/48 |
| 2014/0254614 | A1* | 9/2014 | Nicholson | H01S 3/06754 372/3 |

* cited by examiner

*Primary Examiner* — Eric L Bolda
(74) *Attorney, Agent, or Firm* — Baker Botts L.L.P.

(57) ABSTRACT

A low-noise amplifier includes a gain medium and two or more amplifier stages. Each amplifier stage includes an optical filter to pass all wavelengths of a respective input optical signal in a given propagation direction over the gain medium and reflect wavelengths above a respective threshold wavelength received in the opposite direction, and a respective Raman pump to inject a pump light centered at a wavelength lower than the threshold wavelength onto the gain medium for transmission in the given direction. A first amplifier stage outputs a first combined optical signal including all wavelengths of the respective input optical signal and a pump light injected by the respective Raman pump. The second amplifier stage receives the first combined optical signal as its input and outputs a second combined optical signal including all wavelengths of the first combined optical signal and a pump light injected by the respective Raman pump.

14 Claims, 5 Drawing Sheets

LOW-NOISE RAMAN AMPLIFIER

BACKGROUND

Field of the Disclosure

The present disclosure relates generally to optical communication networks and, more particularly, to systems and methods for amplification of optical signals using a low-noise Raman amplifier.

Description of the Related Art

Telecommunication, cable television and data communication systems use optical networks to rapidly convey large amounts of information between remote points. In an optical network, information is conveyed in the form of optical signals through optical fibers. Optical fibers may comprise thin strands of glass capable of communicating the signals over long distances. Optical networks often employ modulation schemes to convey information in the optical signals over the optical fibers. Such modulation schemes may include phase-shift keying (PSK), frequency-shift keying (FSK), amplitude-shift keying (ASK), and quadrature amplitude modulation (QAM).

Optical networks may also include various optical elements, such as amplifiers, dispersion compensators, multiplexer/demultiplexer filters, wavelength selective switches (WSS), optical switches, couplers, etc. to perform various operations within the network. In particular, optical networks may include costly optical-electrical-optical (O-E-O) regeneration at colorless, directionless, contentionless reconfigurable optical add-drop multiplexers (CDC ROADMs) when the reach of an optical signal is limited in a single optical path.

As data rates for optical networks continue to increase, reaching up to 1 terabit/s (1 T) and beyond, the demands on optical signal-to-noise ratios (OSNR) also increase, for example, due to the use of advanced modulation formats, such as QAM and PSK with dual polarization. In particular, noise accumulations resulting from cascading of optical amplifiers in an optical network operating at very high data rates may limit the reach of an optical signal at a desired level of OSNR and may result in an increased number of O-E-O regenerations, which is economically disadvantageous.

SUMMARY

In one aspect, a disclosed low-noise amplifier includes a gain medium, a first amplifier stage configured to receive an input optical signal and to output a first combined optical signal, and a second amplifier stage configured to receive the first combined optical signal and to output a second combined optical signal. The first amplifier stage includes a first optical filter configured to pass all wavelengths of the input optical signal through the first optical filter in a first propagation direction over the gain medium and to reflect first wavelengths above a first threshold wavelength received by the first optical filter over the gain medium in a direction opposite the first propagation direction, and a first Raman pump configured to inject a first pump light onto the gain medium for transmission in the first propagation direction, the first pump light being centered at a wavelength lower than the first threshold wavelength. The second amplifier stage includes a second optical filter configured to pass all wavelengths of the first combined optical signal through the second optical filter in the first propagation direction over the gain medium and to reflect second wavelengths above a second threshold wavelength received by the second optical filter over the gain medium in a direction opposite the first propagation direction, and a second Raman pump configured to inject a second pump light onto the gain medium for transmission in the first propagation direction, the second pump light being centered at a wavelength lower than the second threshold wavelength. The first combined optical signal includes all wavelengths of the input optical signal and the first pump light, and the second combined optical signal includes all wavelengths of the first combined optical signal and the second pump light.

In any of the disclosed embodiments, the amplifier may further include at least one additional amplifier stage, each additional amplifier stage being configured to receive a combined optical signal from a previous amplifier stage and to output a respective combined optical signal. Each additional amplifier stage may include a respective optical filter configured to pass all wavelengths of the received combined optical signal through the respective optical filter in the first propagation direction over the gain medium and to reflect respective wavelengths above a respective threshold wavelength received by the respective optical filter over the gain medium in a direction opposite the first propagation direction, the respective threshold wavelength being lower than a threshold wavelength at the previous amplifier stage, and a respective Raman pump configured to inject a respective pump light onto the gain medium for transmission in the first propagation direction, the respective pump light being centered at a wavelength lower than the respective threshold wavelength. The respective combined optical signal output by the additional amplifier stage may include all wavelengths of the received combined signal and the respective pump light.

In any of the disclosed embodiments, the first threshold wavelength may be approximately 1520 nanometers, the first pump light may be centered at a wavelength of approximately 1510 nanometers, the second threshold wavelength may be approximately 1490 nanometers, the second pump light may be centered at a wavelength of approximately 1480 nanometers, the respective threshold wavelength of a third amplifier stage may be approximately 1460 nanometers, the respective pump light injected into the gain medium at the third amplifier stage may be centered at a wavelength of approximately 1450 nanometers, the respective threshold wavelength of a fourth amplifier stage may be approximately 1430 nanometers, and the respective pump light injected into the gain medium at the fourth amplifier stage may be centered at a wavelength of approximately 1420 nanometers.

In any of the disclosed embodiments, the first Raman pump may include a first Fabry Perot laser configured to generate the first pump light, and the second Raman pump may include a second Fabry Perot laser configured to generate the second pump light.

In any of the disclosed embodiments, the first Raman pump may further include a first temperature controller configured to tune the first Fabry Perot laser to shift the wavelength at which the first pump light is centered toward the wavelength lower than the first threshold wavelength, and the second Raman pump may further include a second temperature controller configured to tune the second Fabry Perot laser to shift the wavelength at which the second pump light is centered toward the wavelength lower than the second threshold wavelength.

In any of the disclosed embodiments, the first Raman pump may be configured to shift the wavelength at which the first pump light is centered toward the wavelength lower than the first threshold wavelength responsive to a first tuning current, and the second Raman pump may be configured to shift the wavelength at which the second pump light is centered toward the wavelength lower than the second threshold wavelength responsive to a second tuning current.

In any of the disclosed embodiments, the amplifier may further include one or more optical elements configured to isolate the amplifier from signals propagated toward the amplifier in a direction counter to the first propagation direction.

In any of the disclosed embodiments, the amplifier may be a discrete Raman amplifier, and the gain medium may be a fiber exhibiting a chromatic dispersion of more than 4 picoseconds per nanometer of wavelength change per kilometer of propagation distance.

In any of the disclosed embodiments, the amplifier may be a distributed Raman amplifier, and the gain medium may be an optical transmission fiber.

In any of the disclosed embodiments, the input optical signal may be a wavelength division multiplexed (WDM) signal.

In another aspect, a disclosed method is for low-noise amplification of optical signals. The method includes receiving, at a first stage of an amplifier, an input optical signal, passing all wavelengths of the input optical signal through a first optical filter in a first propagation direction over a gain medium, the first optical filter reflecting first wavelengths above a first threshold wavelength received by the first optical filter over the gain medium in a direction opposite the first propagation direction, injecting a first pump light from a first Raman pump onto the gain medium for transmission in the first propagation direction, the first pump light being centered at a wavelength lower than the first threshold wavelength, providing, over the gain medium, a first combined optical signal including all wavelengths of the input optical signal and the first pump light to a second stage of the amplifier, receiving, at the second stage of the amplifier, the first combined optical signal, passing all wavelengths of the first combined optical signal, including the first pump light, through the second optical filter in the first propagation direction over the gain medium, the second optical filter reflecting second wavelengths above a second threshold wavelength received by the second optical filter over the gain medium in a direction opposite the first propagation direction, the second threshold wavelength being lower than the first threshold wavelength, injecting a second pump light from a second Raman pump onto the gain medium for transmission in the first propagation direction, the second pump light being centered at a wavelength lower than the second threshold wavelength, and outputting a second combined optical signal including all wavelengths of the first combined optical signal and the second pump light.

In any of the disclosed embodiments, the method may further include, at each of one or more additional stages of the amplifier, receiving, at the additional stage of the amplifier from a previous stage of the amplifier over the gain medium, a combined optical signal output by the previous stage of the amplifier, the received combined optical signal including all wavelengths passed through a respective optical filter at the previous stage of the amplifier and a pump light injected onto the gain medium by a respective Raman pump at the previous stage of the amplifier, passing all wavelengths of the received combined optical signal through a respective optical filter in the first propagation direction over the gain medium and reflecting respective wavelengths above a respective threshold wavelength received by the respective optical filter over the gain medium in a direction opposite the first propagation direction, the respective threshold wavelength being lower than a respective threshold wavelength of a respective optical filter at the previous stage of the amplifier, injecting a respective pump light from a respective Raman pump onto the gain medium for transmission in the first propagation direction, the respective pump light being centered at a wavelength lower than the respective threshold wavelength, and outputting a respective combined optical signal including all wavelengths of the received combined signal and the respective pump light.

In any of the disclosed embodiments, the method may further include generating the first pump light at the first Raman pump using a first Fabry Perot laser and generating the second pump light at the second Raman pump using a second Fabry Perot laser.

In any of the disclosed embodiments, the method may further include tuning, using a first temperature controller, the first Fabry Perot laser to shift the wavelength at which the first pump light is centered toward the wavelength lower than the first threshold wavelength, and tuning, using a second temperature controller, the second Fabry Perot laser to shift the wavelength at which the second pump light is centered toward the wavelength lower than the second threshold wavelength.

In any of the disclosed embodiments, the method may further include applying a first tuning current to the first Raman pump to shift the wavelength at which the first pump light is centered toward the wavelength lower than the first threshold wavelength, and applying a second tuning current to the second Raman pump to shift the wavelength at which the second pump light is centered toward the wavelength lower than the second threshold wavelength.

In any of the disclosed embodiments, the input optical signal is a wavelength division multiplexed (WDM) signal.

In yet another aspect, a disclosed optical system for low-noise amplification of optical signals includes a transmitter configured to transmit an input optical signal and a low-noise Raman amplifier. The low-noise Raman amplifier includes a gain medium and a plurality of amplifier stages, including a first amplifier stage configured to receive the input optical signal and to output a first combined optical signal and one or more additional amplifier stages, each additional amplifier stage being configured to receive a combined optical signal from a previous amplifier stage and to output a respective combined optical signal. The first amplifier stage includes a first optical filter configured to pass all wavelengths of the input optical signal through the first optical filter in a first propagation direction over the gain medium and to reflect first wavelengths above a first threshold wavelength received by the first optical filter over the gain medium in a direction opposite the first propagation direction, and a first Raman pump configured to inject a first pump light onto the gain medium for transmission in the first propagation direction, the first pump light being centered at a wavelength lower than the first threshold wavelength. Each additional amplifier stage includes a respective optical filter configured to pass all wavelengths of the received combined optical signal through the respective optical filter in the first propagation direction over the gain medium and to reflect respective wavelengths above a respective threshold wavelength received by the respective optical filter over the gain medium in a direction opposite the first propagation direction, the respective threshold wavelength being lower than a threshold wavelength at the previous amplifier stage, and a respective Raman pump configured to inject a respective pump light onto the gain medium for transmission in the first propagation direction, the respective pump light being centered at a wavelength lower than the respective threshold wavelength. The first combined optical signal includes all wavelengths of the input optical signal and the first pump light and, for each of the additional amplifier stages, the respective combined optical signal output by the additional amplifier stage includes all wavelengths of the received combined signal and the respective pump light.

In any of the disclosed embodiments, the first Raman pump may include a first Fabry Perot laser configured to generate the first pump light, and the respective Raman pump at each of the additional amplifier stages may include a respective Fabry Perot laser configured to generate the respective pump light.

In any of the disclosed embodiments, the first Raman pump may further include a first temperature controller configured to tune the first Fabry Perot laser to shift the wavelength at which the first pump light is centered toward the wavelength lower than the first threshold wavelength and the respective Raman pump at each of the additional amplifier stages may further include a respective temperature controller configured to tune the respective Fabry Perot laser to shift the wavelength at which the respective pump light is centered toward the wavelength lower than the respective threshold wavelength.

In any of the disclosed embodiments, the input optical signal may be a wavelength division multiplexed (WDM) signal.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
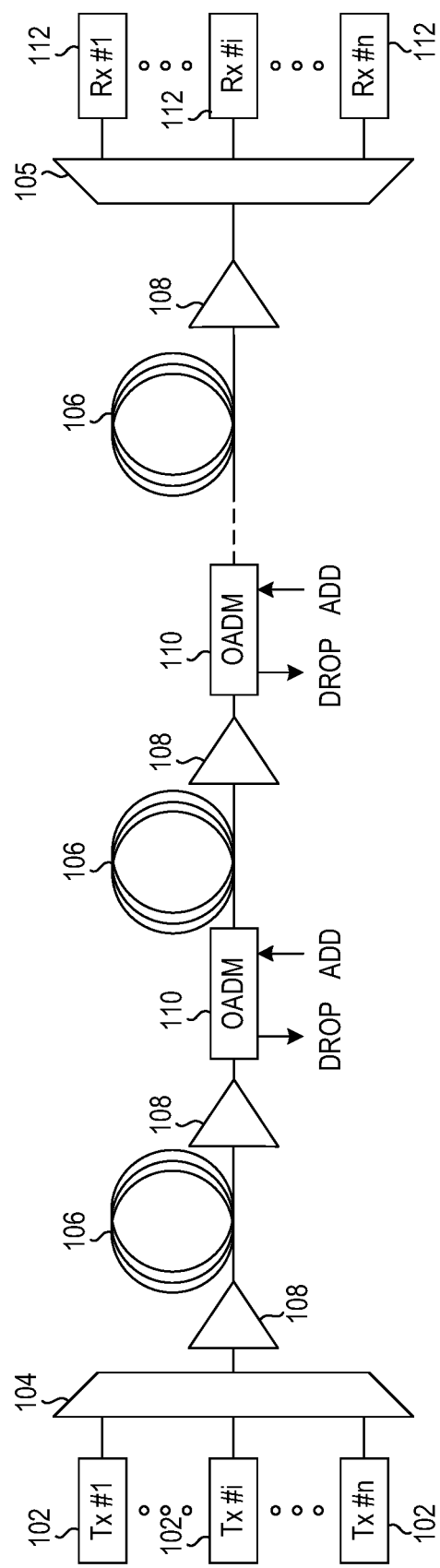
FIG. 1 is a block diagram of selected elements of an embodiment of an optical network.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), device "12-1" refers to an instance of a device class, which may be referred to collectively as devices "12" and any one of which may be referred to generically as a device "12". In the figures and the description, like numerals are intended to represent like elements.

Referring now to the drawings, FIG. 1 illustrates an example embodiment of optical network 101, which may represent an optical communication system. Optical network 101 may include one or more optical fibers 106 to transport one or more optical signals communicated by components of optical network 101. The network elements of optical network 101, coupled together by fibers 106, may comprise one or more transmitters 102, one or more multiplexers (MUX) 104, one or more optical amplifiers 108, one or more optical add/drop multiplexers (OADM) 110, one or more demultiplexers (DEMUX) 105, and one or more receivers 112.

Optical network 101 may comprise a point-to-point optical network with terminal nodes, a ring optical network, a mesh optical network, or any other suitable optical network or combination of optical networks. Optical network 101 may be used in a short-haul metropolitan network, a long-haul inter-city network, or any other suitable network or combination of networks. The capacity of optical network 101 may include, for example, 100 Gbit/s, 400 Gbit/s, or 1 Tbit/s. Optical fibers 106 comprise thin strands of glass capable of communicating the signals over long distances with very low loss. Optical fibers 106 may comprise a suitable type of fiber selected from a variety of different fibers for optical transmission. Optical fibers 106 may include any suitable type of fiber, such as a Single-Mode Fiber (SMF), Enhanced Large Effective Area Fiber (E-LEAF), or TrueWave® Reduced Slope (TW-RS) fiber.

Optical network 101 may include devices to transmit optical signals over optical fibers 106. Information may be transmitted and received through optical network 101 by modulation of one or more wavelengths of light to encode the information on the wavelength. In optical networking, a wavelength of light may also be referred to as a channel that is included in an optical signal. Each channel may carry a certain amount of information through optical network 101.

To increase the information capacity and transport capabilities of optical network 101, multiple signals transmitted at multiple channels may be combined into a single wide-band optical signal. The process of communicating information at multiple channels is referred to in optics as wavelength division multiplexing (WDM). Coarse wavelength division multiplexing (CWDM) refers to the multiplexing of wavelengths that are widely spaced having low number of channels, usually greater than 20 nm and less than sixteen wavelengths, and dense wavelength division multiplexing (DWDM) refers to the multiplexing of wavelengths that are closely spaced having large number of channels, usually less than 0.8 nm spacing and greater than forty wavelengths, into a fiber. WDM or other multi-wavelength multiplexing transmission techniques are employed in optical networks to increase the aggregate bandwidth per optical fiber. Without WDM, the bandwidth in optical networks may be limited to the bit-rate of solely one wavelength. With more bandwidth, optical networks are capable of transmitting greater amounts of information. Optical network 101 may transmit disparate channels using WDM or some other suitable multi-channel multiplexing technique, and to amplify the multi-channel signal.

Optical network 101 may include one or more optical transmitters (Tx) 102 to transmit optical signals through optical network 101 in specific wavelengths or channels. Transmitters 102 may comprise a system, apparatus or device to convert an electrical signal into an optical signal and transmit the optical signal. For example, transmitters 102 may each comprise a laser and a modulator to receive electrical signals and modulate the information contained in the electrical signals onto a beam of light produced by the laser at a particular wavelength, and transmit the beam for carrying the signal throughout optical network 101.

Multiplexer 104 may be coupled to transmitters 102 and may be a system, apparatus or device to combine the signals transmitted by transmitters 102, e.g., at respective individual wavelengths, into a WDM signal.

Optical amplifiers 108 may amplify the multi-channeled signals within optical network 101. Optical amplifiers 108 may be positioned before or after certain lengths of fiber 106. Optical amplifiers 108 may comprise a system, apparatus, or device to amplify optical signals. For example, optical amplifiers 108 may comprise an optical repeater that amplifies the optical signal. This amplification may be performed with opto-electrical or electro-optical conversion. In some embodiments, optical amplifiers 108 may comprise an optical fiber doped with a rare-earth element to form a doped fiber amplification element. When a signal passes through the fiber, external energy may be applied in the form of an optical pump to excite the atoms of the doped portion of the optical fiber, which increases the intensity of the optical signal. For example, in some existing optical networks, each optical amplifier 108 may comprise an erbium-doped fiber amplifier (EDFA). This type of optical amplifier is based on a mature technology and is in widespread use in the field. However, it can only be used to amplify optical signals within a relatively narrow range of wavelengths, such as optical signals within the C-band (1530 nm to 1565 nm) or optical signals with the L-band (1560 nm to 1600 nm) but not both.

Other types of amplifiers, including those based on fiber nonlinearities have been investigated in an attempt to increase gain bandwidth, e.g., to amplify optical signals with wavelengths in both the C-band and the L-band or to amplify optical signals in other wavelength ranges, such as the S-band (1480 nm to 1520 nm). For example, in Raman amplifiers, the light-amplification effect (known as stimulated Raman scattering) is achieved by a nonlinear interaction within the gain medium between the optical signal being transmitted and amplified and a pump light generated and injected into the gain medium by a laser. Amplifiers based on fiber nonlinearities may be wavelength independent. However, due to inefficiencies of these approaches, many such amplifiers have, to date, exhibited much worse noise performance than EDFA amplifiers, especially when applied in a discrete amplifier context. For example, attempts to utilize discrete Raman amplifiers have not been particularly successful due to exhibiting poor noise performance. A discrete Raman amplifier is one in which a dedicated, relatively short length of a highly nonlinear fiber with a small fiber core is used to provide amplification. The use of such specialized fibers increases the interaction between the optical signal and the injected pump light, thereby reducing the length of fiber required. In some cases, the use of amplifiers based on fiber nonlinearities have been shown to exhibit better noise performance than EDFA amplifiers when applied in a distributed amplifier context. In a distributed Raman amplifier, the optical transmission medium, rather than a specialized fiber, is used as the gain medium.

Some existing systems include a backward pumping Raman amplifier with Fiber Bragg grating (FBG) wavelength stabilized pumps located at or near the receiving end of a transmission fiber to amplify an optical signal during transmission. Using transmission fiber as the gain medium may prevent noise accumulation because any generated noise may be attenuated by transmission fiber loss. The term "backward pumping" refers to the fact that the pump light injected by a Raman pump is transmitted in the direction counter to the propagation direction in which the optical signal being amplified is transmitted. In some existing systems, a backward pumping Raman amplifier includes a semiconductor laser, which is used to generate the pump light. By contrast, in a "forward pumping" Raman amplifier, pump light injected by a Raman pump is transmitted in the same direction as the propagation direction in which the optical signal being amplified is transmitted. In other words, the added pump light may be co-propagated with the optical signal.

In backward pumping Raman amplifiers, even though the power fluctuates, because the interaction time between the pump light and the optical signal is very limited, only the pump power of the injected pump light is transferred to the optical signal, but not the noise due to the fluctuation, which is referred to as relative intensity noise (RIN). In some cases, the RIN of a backward pumping Raman amplifier may be relatively high (e.g., on the order of 130 dB/Hz). In fact, its noise performance may be slightly worse than for a forward pumping Raman amplifier and may be unacceptable. In general, forward pumping Raman amplifiers may provide better noise performance than backward pumping Raman amplifiers. However, in existing forward pumping Raman amplifiers, pump noise (e.g., RIN) can be easily transferred to the optical signal. For example, because the pump light is transmitted in the same direction as the optical signal, not only is the pump power of the injected pump light transferred to the signal, but also the pump noise.

In some embodiments of the present disclosure, each optical amplifier 108 may be a low-noise discrete Raman amplifier. As described in more detail herein, each such optical amplifier 108 may be configured to compensate for noise issues related to the implementation of a forward pumping Raman amplifier. More specifically, the low-noise Raman amplifiers may include multiple cascading Fabry Perot (FP) lasers, which exhibit low MN, and may provide wide bandwidth amplification, e.g., a gain bandwidth wide enough to include wavelengths in both the C-band and the L-band. The gain medium used in the low-noise Raman amplifier may have a chromatic dispersion selected to prevent four wave mixing and may include temperature controllers for tuning individual ones of the FP lasers. Unlike with backward pumping Raman amplifiers that inject pump light at or near the end of a transmission fiber (e.g., in the last 20 km of an 80-100 km transmission fiber), the forward pumping Raman amplifiers described herein may inject pump light at multiple wavelengths at or near the beginning of the transmission length (e.g., between zero and 20 km) and any resulting noise may be attenuated over the remaining length of the transmission fiber (e.g., over 80-100 km).

OADMs 110 may be coupled to optical network 101 via fibers 106. OADMs 110 comprise an add/drop module, which may include a system, apparatus or device to add and drop optical signals (for example at individual wavelengths) from fibers 106. After passing through an OADM 110, an optical signal may travel along fibers 106 directly to a destination, or the signal may be passed through one or more additional OADMs 110 and optical amplifiers 108 before reaching a destination.

In certain embodiments of optical network 101, OADM 110 may represent a reconfigurable OADM (ROADM) that is capable of adding or dropping individual or multiple wavelengths of a WDM signal. The individual or multiple wavelengths may be added or dropped in the optical domain, for example, using a wavelength selective switch (WSS) (see also FIG. 2) that may be included in a ROADM.

As shown in FIG. 1, optical network 101 may also include one or more demultiplexers 105 at one or more destinations of network 101. Demultiplexer 105 may comprise a system apparatus or device that acts as a demultiplexer by splitting a single composite WDM signal into individual channels at respective wavelengths. For example, optical network 101 may transmit and carry a forty (40) channel DWDM signal. Demultiplexer 105 may divide the single, forty channel DWDM signal into forty separate signals according to the forty different channels. It will be understood that different numbers of channels or subcarriers may be transmitted and demultiplexed in optical transport network 101, in various embodiments.

In FIG. 1, optical network 101 may also include receivers 112 coupled to demultiplexer 105. Each receiver 112 may receive optical signals transmitted at a particular wavelength or channel, and may process the optical signals to obtain (e.g., demodulate) the information (i.e., data) that the optical signals contain. Accordingly, network 101 may include at least one receiver 112 for every channel of the network.

Optical networks, such as optical network 101 in FIG. 1, may employ modulation techniques to convey information in the optical signals over the optical fibers. Such modulation schemes may include phase-shift keying (PSK), frequency-shift keying (FSK), amplitude-shift keying (ASK), and quadrature amplitude modulation (QAM), among other examples of modulation techniques. In PSK, the information carried by the optical signal may be conveyed by modulating the phase of a reference signal, also known as a carrier wave, or simply, a carrier. The information may be conveyed by modulating the phase of the signal itself using two-level or binary phase-shift keying (BPSK), four-level or quadrature phase-shift keying (QPSK), multi-level phase-shift keying (M-PSK) and differential phase-shift keying (DPSK). In QAM, the information carried by the optical signal may be conveyed by modulating both the amplitude and phase of the carrier wave. PSK may be considered a subset of QAM, wherein the amplitude of the carrier waves is maintained as a constant.

Additionally, polarization division multiplexing (PDM) technology may enable achieving a greater bit rate for information transmission. PDM transmission comprises independently modulating information onto different polarization components of an optical signal associated with a channel. In this manner, each polarization component may carry a separate signal simultaneously with other polarization components, thereby enabling the bit rate to be increased according to the number of individual polarization components. The polarization of an optical signal may refer to the direction of the oscillations of the optical signal. The term "polarization" may generally refer to the path traced out by the tip of the electric field vector at a point in space, which is perpendicular to the propagation direction of the optical signal.

In an optical network, such as optical network 101 in FIG. 1, it is typical to refer to a management plane, a control plane, and a transport plane (sometimes called the physical layer). A central management host (not shown) may reside in the management plane and may configure and supervise the components of the control plane. The management plane includes ultimate control over all transport plane and control plane entities (e.g., network elements). As an example, the management plane may consist of a central processing center (e.g., the central management host), including one or more processing resources, data storage components, etc. The management plane may be in electrical communication with the elements of the control plane and may also be in electrical communication with one or more network elements of the transport plane. The management plane may perform management functions for an overall system and provide coordination between network elements, the control plane, and the transport plane. As examples, the management plane may include an element management system (EMS) which handles one or more network elements from the perspective of the elements, a network management system (NMS) which handles many devices from the perspective of the network, and an operational support system (OSS) which handles network-wide operations.

Modifications, additions or omissions may be made to optical network 101 without departing from the scope of the disclosure. For example, optical network 101 may include more or fewer elements than those depicted in FIG. 1. Also, as mentioned above, although depicted as a point-to-point network, optical network 101 may comprise any suitable network topology for transmitting optical signals such as a ring, a mesh, and a hierarchical network topology.

As discussed above, the amount of information that may be transmitted over an optical network may vary with the number of optical channels coded with information and multiplexed into one signal. Accordingly, an optical fiber employing a WDM signal may carry more information than an optical fiber that carries information over a single channel. Besides the number of channels and number of polarization components carried, another factor that affects how much information can be transmitted over an optical network may be the bit rate of transmission. The higher the bit rate, the greater the transmitted information capacity. Achieving higher bit rates may be limited by the availability of wide bandwidth electrical driver technology, digital signal processor technology and increase in the required OSNR for transmission over optical network 101.

In at least some embodiments, the low-noise Raman amplifiers described herein may include forward pumping Raman pumps that use the attenuation of the gain medium to attenuate noise generated by the Raman amplification. The gain medium may be selected to prevent four wave mixing between the longitudinal mode of the FP lasers and WDM signals. For example, in some embodiments, a gain medium having a chromatic dispersion characteristic of more than l4 psl/nm/km may be sufficient to prevent four wave mixing.

Traditionally, Fabry Perot (FP) lasers have not been not used in Raman amplifiers because of a need for wider gain bandwidth and, in some cases, for wavelength shifting. However, the low-noise Raman amplifiers described herein may include low RIN FP lasers to prevent intensity noise transfer from pump light to optical signals due to long interaction period. In at least some embodiments, each FP laser may be paired with a respective temperature controller used to tune its oscillated longitudinal modes. The gain profile of the low-noise Raman amplifiers may be further controlled using current tuning.

In at least some optical transmission applications, it may be desirable for an optical amplifier to have a gain bandwidth greater than 30 nm. However, the use of an individual Raman pump may yield a relatively narrow gain bandwidth range (e.g., on the order of 20 nm). In at least some embodiments, the low-noise Raman amplifiers described herein may use cascaded wavelength adding to combine pump light generated by the FP lasers into the gain medium. Each pump light may be combined with at least some wavelengths of an input optical signal at a WDM filter. By combining multiple cascading Raman pumps, the overall gain bandwidth of the low-noise Raman amplifiers described herein may be much wider than for an individual Raman pump (e.g., 20 nm times number of stages). In at least some embodiments, the wavelength about which each pump light generated by a respective Raman pump is centered may be tuned (e.g., shifted by an amount on the order of 10 nm) using a respective temperature controller. Further shifting may be achieved using current tuning, in some embodiments. The techniques described herein for cascaded wavelength adding and tuning may be implemented in a low-noise Raman amplifier that can amplify optical signals in a wider gain bandwidth, or a different gain bandwidth range, than existing optical amplifiers with very little noise added to the signal.

In the descriptions that follow, some embodiments of a low-noise Raman amplifier are described as being discrete Raman amplifiers. In other embodiments, the techniques described herein may also be applied to a distributed Raman amplifier in which the transmission fiber is used as the gain medium.

Figure 2:
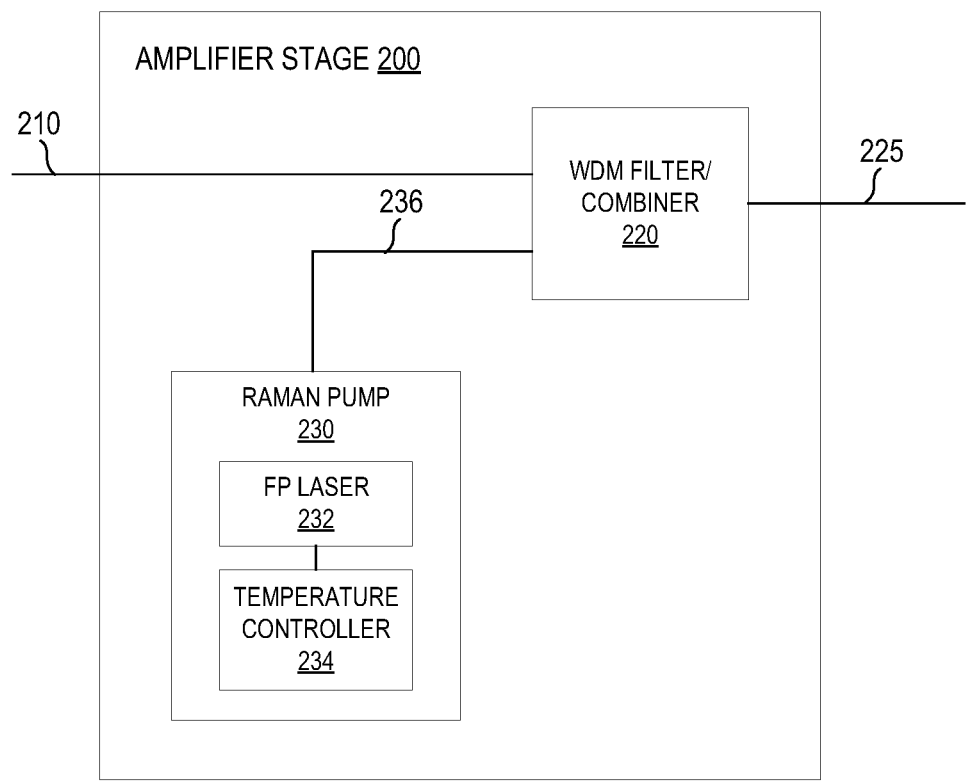
FIG. 2 is a block diagram of selected elements of an embodiment of a single amplifier stage of a low-noise Raman amplifier.

FIG. 2 is a block diagram of selected elements of an embodiment of a single amplifier stage of a low-noise Raman amplifier that includes multiple amplifier stages. As illustrated in this example, in at least some embodiments, each stage of the low-noise Raman amplifiers described herein may be configured to implement forward pumping Raman amplification. In the illustrated example, amplifier stage 200 includes an input optical signal 210, a WDM filter/combiner 220, and a Raman pump 230 configured to pump light to the input optical signal 210 without any loss. In some embodiments, the input optical signal 210 may be a WDM signal on which, for example, 40 or even fifty (50) channels are multiplexed. In the illustrated embodiment, Raman pump 230 includes a Fabry Perot laser (shown as FP laser 232) and a temperature controller for the Fabry Perot laser (shown as temperature controller 234). In operation, amplifier stage 200 may be configured to receive an input optical signal 210, to pass at least some wavelengths of the input optical signal 210 through WDM filter/combiner 220, and to inject high-powered pump light centered at a particular wavelength into the gain medium, outputting a combined optical signal 225.

In the illustrated example, all wavelengths of the input optical signal 210 received from the left side of amplifier stage 200 may be passed through WDM filter/combiner 220. A pump light 236 generated by Raman pump 230 may be centered at a wavelength that is less than a threshold wavelength for the WDM filter/combiner 220. In this case, WDM filter/combiner 220 may act as a combiner to combine the input optical signal 210 with pump light 236, rather than to filter input optical signal 210. However, wavelengths of any optical signals that are received from the right side of amplifier stage 200 less than the threshold wavelength for the WDM filter/combiner 220 may be reflected by WDM filter/combiner 220. The pump light 236, which may have a higher optical power than that of any reflected wavelengths, may be injected at a point to the right of the filtering component of WDM filter/combiner 220 (where it is reflected by the filtering component of WDM filter/combiner 220) and may be combined with the wavelengths of the input optical signal 210 that passed through the WDM filter/combiner 220 for transmission to the next amplifier stage. The combined output signal shown in FIG. 2 as combined optical signal 225 may thus include all wavelengths of the input optical signal 210 plus the injected pump light 236. For example, the pump light 236 generated by Raman pump 230 may be injected into the gain medium of the Raman amplifier for transmission in the same direction as the propagation direction of the wavelengths of the input optical signal 210.

The wavelength of the pump light generated by a Fabry Perot laser is dependent on temperature. In the illustrated embodiment, temperature controller 234 may be used to tune the wavelength at which the pump light generated by FP laser 232 is centered. In some embodiments, the respective temperature controller 234 within each amplifier stage 200 may include control logic (not shown), such as a microcontroller or microprocessor having access to a non-transitory memory media storing executable instructions to perform temperature control for the respective FP laser 232 at that amplifier stage. Accordingly, each Raman pump 230 may operate independently with regard to temperature control in order to provide individual tuning of the pump light at a respective amplifier stage. The gain bandwidth of an individual Fabry Perot laser is on the order of 20 nm. Temperature controller 234 may be used to shift the wavelength about which the pump light produced by FP laser 232 is centered to a shorter or longer wavelength. For example, shifting the pump light so that it is centered about a wavelength that is shorter than the threshold wavelength of the WDM filter/combiner 220 may ensure that the pump light is not cut out by the WDM filter/combiner 220. Wavelengths less than the WDM filter/combiner threshold may be combined back into the optical signal as injected pump light.

Figure 3:
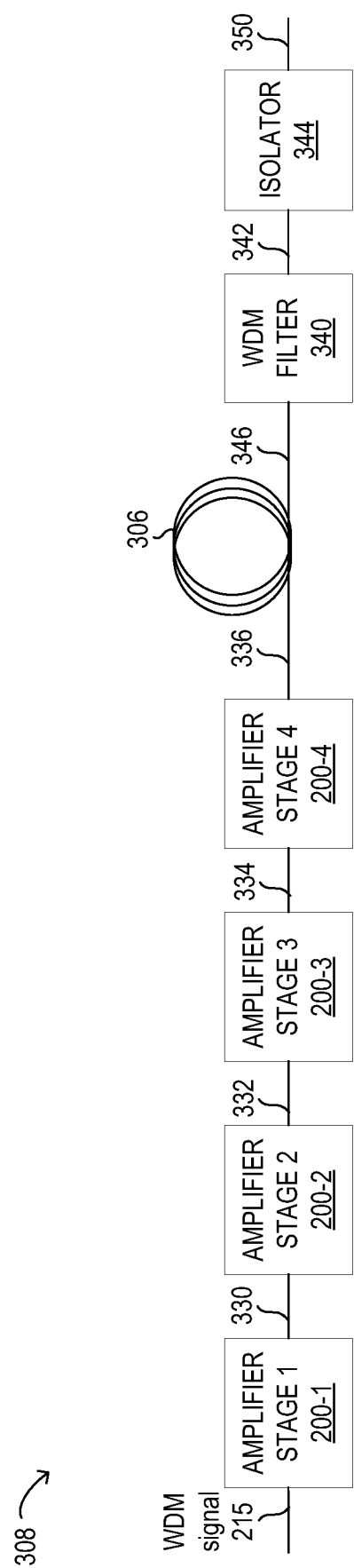
FIG. 3 is a block diagram of selected elements of an embodiment of a low-noise Raman amplifier including multiple amplifier stages.

FIG. 3 is a block diagram of selected elements of an embodiment of a low-noise Raman amplifier including multiple amplifier stages. In the illustrated embodiment, Raman amplifier 308 includes four amplifier stages 200, each of which may be similar to amplifier stage 200 illustrated in FIG. 2. More specifically, Raman amplifier 308 includes four cascaded amplifier stages 200, each including a respective Fabry Perot laser tuned to inject a pump light centered at a different wavelength than the others input an optical signal, thus increasing the gain bandwidth of the amplifier compared to a single stage Raman amplifier with a Fabry Perot laser. In the illustrated example, the wavelengths at which the pump lights of consecutive amplifier stages 200 are centered are 30 nm apart. Note that, due to the fact that fiber loss is wavelength dependent and because of the power transfer from shorter wavelength pumps to longer wavelength pumps in amplifier 308, to achieve a relatively flat gain profile, at least some of the shorter wavelength pumps in the latter stages of amplifier 308 may include higher powered Fabry Perot lasers than those in the earlier stages.

In the example embodiment illustrated in FIG. 3, at amplifier stage 1 (200-1), the threshold wavelength for the respective WDM filter/combiner 220 within the amplifier stage is 1520 nm, which may allow optical signals containing wavelengths in both the C-band and the L-band to pass through the filter in either direction. The respective Raman pump 230 within the amplifier stage includes a 100 mW Fabry Perot laser that generates a pump light centered at 1510 nm and injects it into the gain medium (e.g., the fiber core of the amplifier) in the same direction as the propagation direction of the wavelengths that pass through the respective WDM filter/combiner 220. The wavelength at which the pump light is centered may be tuned by the respective temperature controller 234 with the amplifier stage.

An optical signal input to amplifier stage 1 (200-1) is shown as WDM signal 215. In some embodiments, 40 or even 50 optical channels may be multiplexed onto WDM signal 215. The output of amplifier stage 1 (200-1) is a combined optical signal 330, including all wavelengths that are passed through the WDM filter/combiner within amplifier stage 1 (200-1) plus the injected pump light centered at 1510 nm, carried over the gain medium. In embodiments in which Raman amplifier 308 is a discrete amplifier, such as amplifier 108 shown in FIG. 1, the gain medium (shown as fiber 306) may be selected to prevent four wave mixing. In one example, the selected gain medium may be a highly nonlinear fiber that is 300 meters long and is characterized as incurring a transmission loss of 0.8 dB/km and having a chromatic dispersion of −5 ps/nm/km. In embodiments in which amplifier 308 is a distributed amplifier, the gain medium may be an optical transmission medium, such as any suitable type of optical fiber 106 shown in FIG. 1 and described above.

At amplifier stage 2 (200-2), the threshold wavelength for the respective WDM filter/combiner 220 within the amplifier stage is 1490 nm. The respective Raman pump 230 within amplifier stage 2 includes a 200 mW Fabry Perot laser that generates a pump light centered at 1480 nm and injects it into the gain medium in the same direction as the propagation direction of the wavelengths that pass through the respective WDM filter/combiner 220. The wavelength at which the pump light is centered may be tuned by the respective temperature controller 234 with the amplifier stage.

In this example, the optical signal input to amplifier stage 2 (200-2) is the combined optical signal 330 provided by amplifier stage 1 (200-1). The output of amplifier stage 2 (200-2) is a combined optical signal 332, including all wavelengths that are passed through the respective WDM filter/combiner 220 within amplifier stage 2 (200-2) plus the injected pump light centered at 1510 nm and the injected pump light centered at 1480 nm, carried over the gain medium.

At amplifier stage 3 (200-3), the threshold wavelength for the respective WDM filter/combiner 220 within the amplifier stage is 1460 nm. The respective Raman pump 230 within amplifier stage 3 includes a 200 mW Fabry Perot laser that generates a pump light centered at 1450 nm and injects it into the gain medium in the same direction as the propagation direction of the wavelengths that pass through the respective WDM filter/combiner 220. The wavelength at which the pump light is centered may be tuned by the respective temperature controller 234 with the amplifier stage.

The optical signal input to amplifier stage 3 (200-3) is the combined optical signal 332 provided by amplifier stage 2 (200-2). The output of amplifier stage 3 (200-3) is a combined optical signal 334, including all wavelengths that are passed through the respective WDM filter/combiner 220 within amplifier stage 3 (200-3) plus the injected pump light centered at 1510 nm, the injected pump light centered at 1480 nm, and the injected pump light centered at 1450 nm, carried over the gain medium.

At amplifier stage 4 (200-4), the threshold wavelength for the respective WDM filter/combiner 220 within the amplifier stage is 1430 nm. The respective Raman pump 230 within amplifier stage 4 includes a 250 mW Fabry Perot laser that generates a pump light centered at 1420 nm and injects it into the gain medium in the same direction as the propagation direction of the wavelengths that pass through the respective WDM filter/combiner 220. The wavelength at which the pump light is centered may be tuned by the respective temperature controller 234 with the amplifier stage.

The optical signal input to amplifier stage 4 (200-4) is the combined optical signal 334 provided by amplifier stage 3 (200-3). The output of amplifier stage 4 (200-4) is a combined optical signal 336, including all wavelengths that are passed through the respective WDM filter/combiner 220 within amplifier stage 4 (200-4) plus the injected pump light centered at 1510 nm, the injected pump light centered at 1480 nm, the injected pump light centered at 1450 nm, and the injected pump light centered at 1410 nm, carried over the gain medium. In the illustrated example, the combined optical signal 336 output following the four amplifier stages 200 of Raman amplifier 308 includes the outputs of all four Raman pumps combined with the original WDM signal 215 without loss.

In the illustrated embodiment, low-noise amplifier 308 also includes transmission fiber 306 (which may be any suitable type of optical fiber 106 shown in FIG. 1 and described above) and two isolating elements shown as WDM filter 340 and isolator 344. The optical signal 346 shown if FIG. 3 may represent an amplified version of optical signal 336.

In the illustrated embodiment, WDM filter 340 may be configured to remove the pump light (e.g., by removing wavelengths less than 1520 nm), preventing any additional amplification by amplifier 308. Isolator 344 may be configured to prevent any unknown optical signals from being introduced into amplifier 308 due to, for example, pump light injected into combined optical signal 336 in a direction counter to the propagation direction of combined optical signal 336.

In the illustrated embodiment, the overall gain bandwidth of low-noise Raman amplifier 308 may be on the order of 110 nm. For example, each amplifier stage may have a gain bandwidth greater than or equal to 30 nm. However, because the stages amplify optical signals in different, overlapping ranges, the overall gain bandwidth for the four amplifier stages may be less than four times the gain bandwidth of each individual amplifier stage. In one embodiment low-noise Raman amplifier 308 may be able to amplify optical signals in the range of 1520 to 1630 nm.

Figure 4:
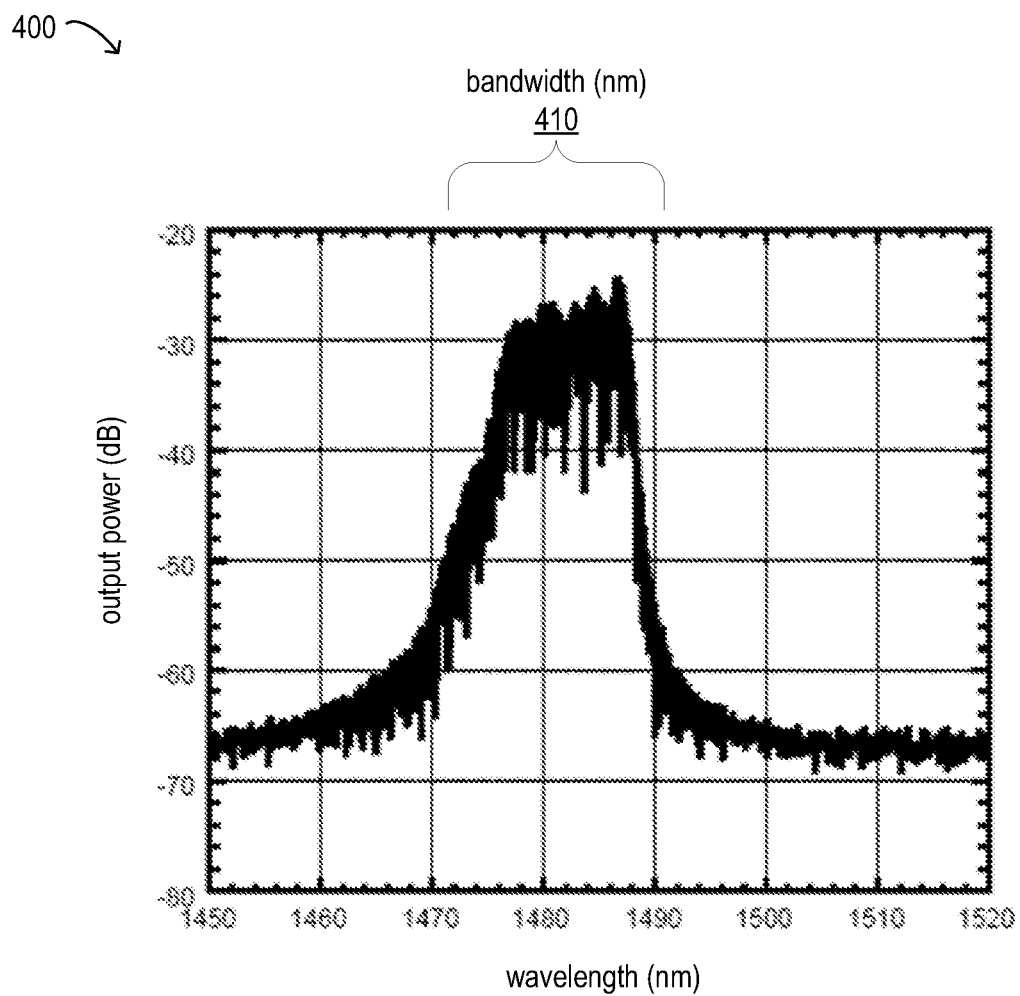
FIG. 4 illustrates an example optical spectrum for a Fabry Perot laser, according to some embodiments.

FIG. 4 illustrates an example optical spectrum for a Fabry Perot laser, according to some embodiments. More specifically, FIG. 4 illustrates a mapping 400 of output power vs. wavelength for a Fabry Perot laser, such as Fabry Perot laser 232 illustrated in FIG. 2. In the illustrated example, output power (in dB) is shown on the vertical axis and wavelength (in nm) is shown on the horizontal axis. As shown in this example, the bandwidth 410 of a Fabry Perot laser is typically on the order of 20 nm and is roughly centered around a particular central wavelength. As described herein, the central wavelength may be shifted using a temperature controller, such as temperature controller 234 illustrated in FIG. 2.

Figure 5:
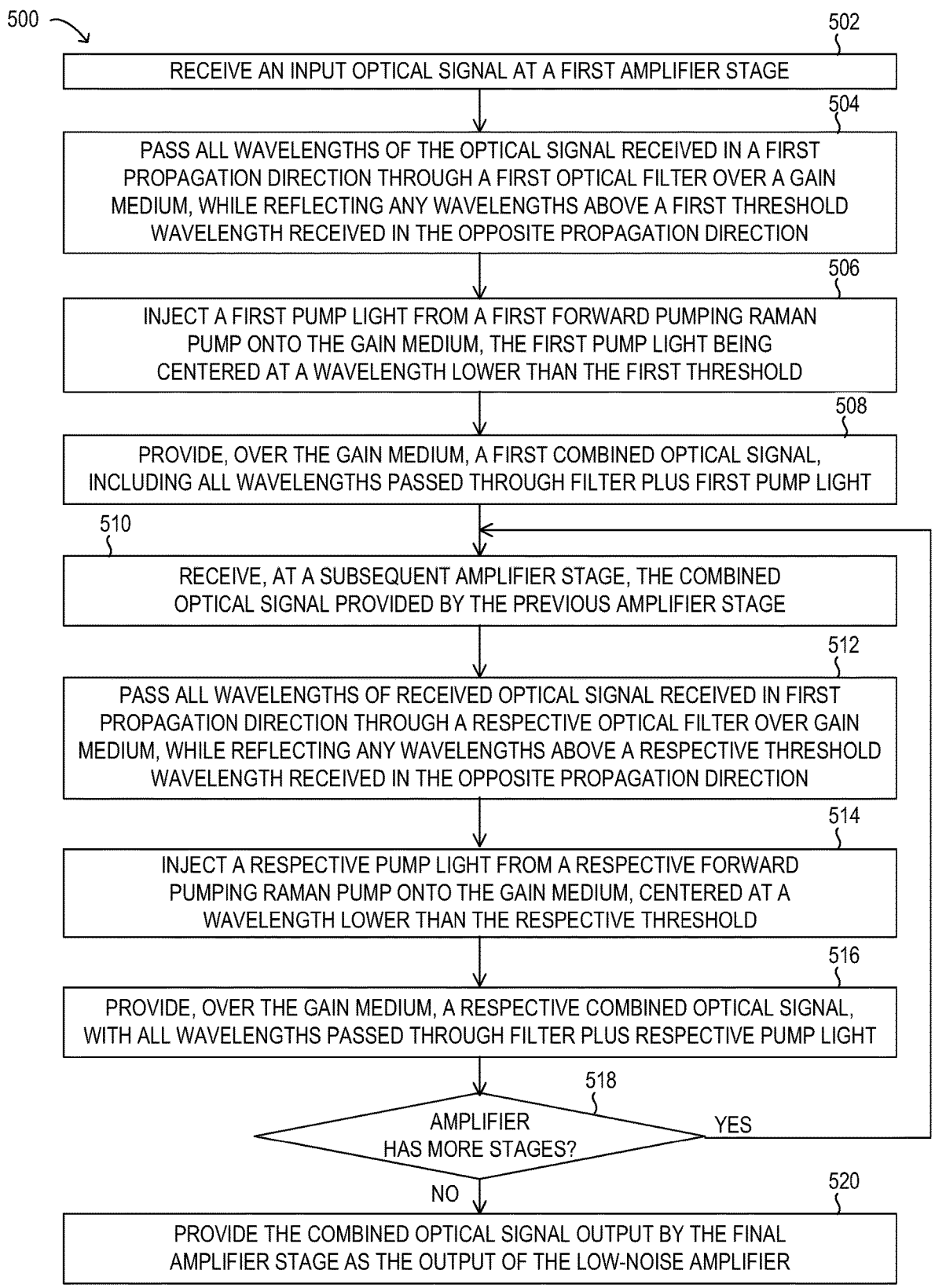
FIG. 5 is a flowchart of selected elements of an embodiment of a method for amplifying optical signals using a low-noise Raman amplifier.

Referring now to FIG. 5, a flowchart of selected elements of an embodiment of method 500 for amplifying optical signals using a low-noise Raman amplifier, as described herein, is depicted. Method 500 may be performed by Raman amplifier 308 illustrated in FIG. 3, in some embodiments. It is noted that certain operations described in method 500 may be optional, may be repeated, or may be rearranged in different embodiments.

Method 500 includes, at 502, receiving an input optical signal at a first amplifier stage of a low-noise Raman amplifier, such as Raman amplifier 308. The input optical signal may be a WDM signal including 40 or even 50 channels that are multiplexed onto the input optical signal, in some embodiments.

The method may also include, at 504, passing all wavelengths of the optical signal received in a first propagation direction through a first optical filter over a gain medium, while reflecting any wavelengths above a first threshold wavelength received in the opposite propagation direction. In some embodiments, the gain medium may be a highly nonlinear fiber with a chromatic dispersion characteristic suitable for preventing four wave mixing, as described above.

Method 500 may include, at 506, injecting a first pump light from a first forward pumping Raman pump onto the gain medium. The first pump light may be centered at a wavelength that is lower than the first threshold wavelength. The first pump light may be generated by a Fabry Perot laser element of the first forward pumping Raman pump. In some embodiments, the wavelength at which the first pump light is centered may be tuned by controlling the temperature of the Fabry Perot laser element of the respective forward pumping Raman pump, as described herein.

The method may also include, at 508, providing, over the gain medium, a first combined optical signal. The first combined signal may include all of the wavelengths that were passed through the first optical filter and the injected first pump light.

In the illustrated embodiment, method 500 includes, at 510, receiving, at a subsequent amplifier stage, the combined optical signal provided by the previous amplifier stage.

The method may also include, at 512, passing all wavelengths of the received optical signal (e.g., the combined optical signal provided by the previous stage) received in the first propagation direction through a respective optical filter over the gain medium, while reflecting any wavelengths above a respective threshold wavelength that are received in the opposite propagation direction.

Method 500 also includes, at 514 injecting a respective pump light from a respective forward pumping Raman pump onto the gain medium, centered at a wavelength that is lower than the respective threshold wavelength. The respective pump light may be generated by a Fabry Perot laser element of the respective forward pumping Raman pump. In some embodiments, the wavelength at which the respective pump light is centered may be tuned by controlling the temperature of the Fabry Perot laser element of the respective forward pumping Raman pump, as described herein.

The method may also include, at 516, providing, over the gain medium, a respective combined optical signal, including all wavelengths that were passed through the respective optical filter, any pump light previously injected onto the gain medium (which may also pass through the respective optical filter) and the respective pump light generated by the respective forward pumping Raman pump.

If, at 518, the low-noise Raman amplifier includes one or more additional amplifier stages, method 500 may return to 510, after which the operations shown as 510-516 may be repeated, as appropriate, for each additional amplifier stage.

If, or once, there are no additional amplifier stages, method 500 may continue at 520, where the combined optical signal output by the final amplifier stage of the low-noise Raman amplifier is provided as the output of the low-noise Raman amplifier.

In at least some embodiments, the low-noise Raman amplifiers described herein may use cascaded wavelength adding to combine pump light generated by multiple FP lasers in respective forward-pumping Raman pumps in the gain medium. Using this and other techniques, the low-noise Raman amplifiers described herein may be configured to amplify optical signals with a gain bandwidth greater than 30 nm even though the output of each individual FP laser has a bandwidth of approximately 20 nm. Temperature and/or current control may be used to tune the FP lasers and shift the resulting gain bandwidth. The techniques described herein may be used to avoid RIN transfer from the forward pumping Raman pumps. However, in some embodiments in which these techniques are not sufficient to completely remove RIN, the low-noise Raman amplifiers described herein may include circuitry and/or optical elements to implement one or more additional signal processing techniques (including, in some cases, digital signal processing technique) at the receiver end of the transmission fiber to remove the rest. The described techniques may be applied in a discrete Raman amplifier or in a distributed Raman amplifier, in different embodiments.

In at least some embodiments, the low-noise Raman amplifiers described herein may avoid issues that degrade the performance of existing optical amplifiers. For example, they may avoid issues related to amplified spontaneous emission (ASE) noise (also known as superluminescence) due to the use of forward pumping Raman pumps. They may avoid the RIN transfer issues of existing forward pumping Raman solutions by introducing Fabry Perot lasers. They may avoid issues related to wavelength shifting when controlling gain bandwidth (e.g., when attempting to flatten the gain bandwidth) by implementing a wider pump combiner architecture. They may prevent four wave mixing between longitudinal modes of the pump lasers and input WDM signals by the use of gain media with moderate chromatic dispersion. Collectively, these techniques may allow the low-noise Raman amplifiers described herein to exhibit a wider gain bandwidth and lower noise than many existing optical amplifiers. In some embodiments, by increasing the optical bandwidth of each of the optical amplifiers in an optical network (such optical amplifiers 108 in optical network 101 illustrated in FIG. 1), the overall system cost of the optical network may be greatly reduced.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A low-noise amplifier, comprising:
a gain medium;
a first amplifier stage configured to receive an input optical signal and to output a first combined optical signal, the first amplifier stage comprising:
a first optical filter configured to pass all wavelengths of the input optical signal through the first optical filter in a first propagation direction over the gain medium and to reflect first wavelengths above a first threshold wavelength received by the first optical filter over the gain medium in a direction opposite the first propagation direction; and
a first Raman pump configured to inject a first pump light onto the gain medium for transmission in the first propagation direction, the first pump light being centered at a wavelength lower than the first threshold wavelength, the first Raman pump comprising a first Fabry Perot laser configured to generate the first pump light, and comprising a first temperature controller configured to tune the first Fabry Perot laser to shift the wavelength at which the first pump light is centered toward the wavelength lower than the first threshold wavelength; and a second amplifier stage configured to receive the first combined optical signal and to output a second combined optical signal, the second amplifier stage comprising:

a second optical filter configured to pass all wavelengths of the first combined optical signal through the second optical filter in the first propagation direction over the gain medium and to reflect second wavelengths above a second threshold wavelength received by the second optical filter over the gain medium in a direction opposite the first propagation direction; and a second Raman pump configured to inject a second pump light onto the gain medium for transmission in the first propagation direction, the second pump light being centered at a wavelength lower than the second threshold wavelength, the second Raman pump comprising a second Fabry Perot laser configured to generate the second pump light, and comprising a second temperature controller configured to tune the second Fabry Perot laser to shift the wavelength at which the second pump light is centered toward the wavelength lower than the second threshold wavelength;

wherein the first combined optical signal includes all wavelengths of the input optical signal and the first pump light, and the second combined optical signal includes all wavelengths of the first combined optical signal and the second pump light.

2. The amplifier of claim 1, further comprising at least one additional amplifier stage, each additional amplifier stage being configured to receive a combined optical signal from a previous amplifier stage and to output a respective combined optical signal, and each additional amplifier stage comprising:

a respective optical filter configured to pass all wavelengths of the received combined optical signal through the respective optical filter in the first propagation direction over the gain medium and to reflect respective wavelengths above a respective threshold wavelength received by the respective optical filter over the gain medium in a direction opposite the first propagation direction, the respective threshold wavelength being lower than a threshold wavelength at the previous amplifier stage; and a respective Raman pump configured to inject a respective pump light onto the gain medium for transmission in the first propagation direction, the respective pump light being centered at a wavelength lower than the respective threshold wavelength;

wherein the respective combined optical signal output by the additional amplifier stage includes all wavelengths of the received combined signal and the respective pump light.

3. The amplifier of claim 2, wherein:
the first threshold wavelength is approximately 1520 nanometers;
the first pump light is centered at a wavelength of approximately 1510 nanometers;

the second threshold wavelength is approximately 1490 nanometers;
the second pump light is centered at a wavelength of approximately 1480 nanometers;
the respective threshold wavelength of a third amplifier stage is approximately 1460 nanometers;
the respective pump light injected into the gain medium at the third amplifier stage is centered at a wavelength of approximately 1450 nanometers;
the respective threshold wavelength of a fourth amplifier stage is approximately 1430 nanometers; and
the respective pump light injected into the gain medium at the fourth amplifier stage is centered at a wavelength of approximately 1420 nanometers.

4. The amplifier of claim 1, wherein:
the first Raman pump is configured to shift the wavelength at which the first pump light is centered toward the wavelength lower than the first threshold wavelength responsive to a first tuning current; and
the second Raman pump is configured to shift the wavelength at which the second pump light is centered toward the wavelength lower than the second threshold wavelength responsive to a second tuning current.

5. The amplifier of claim 1, further comprising an isolator configured to isolate the amplifier from signals propagated toward the amplifier in a direction counter to the first propagation direction.

6. The amplifier of claim 1, wherein:
the amplifier is a discrete Raman amplifier; and
the gain medium is a fiber exhibiting a chromatic dispersion of more than 4 picoseconds per nanometer of wavelength change per kilometer of propagation distance.

7. The amplifier of claim 1, wherein:
the amplifier is a distributed Raman amplifier; and
the gain medium is an optical transmission fiber.

8. The amplifier of claim 1, wherein the input optical signal is a wavelength division multiplexed (WDM) signal.

9. A method for low-noise amplification of optical signals, comprising:

receiving, at a first stage of an amplifier, an input optical signal;

passing all wavelengths of the input optical signal through a first optical filter in a first propagation direction over a gain medium, the first optical filter reflecting first wavelengths above a first threshold wavelength received by the first optical filter over the gain medium in a direction opposite the first propagation direction;

generating a first pump light at a first Rama pump using a first Fabry Perot laser;

tuning, using a first temperature controller, the first Fabry Perot laser to shift a wavelength at which the first pump light is centered toward a wavelength lower than the first threshold wavelength;

injecting the first pump light from the first Raman pump onto the gain medium for transmission in the first propagation direction;

providing, over the gain medium, a first combined optical signal including all wavelengths of the input optical signal and the first pump light to a second stage of the amplifier;

receiving, at the second stage of the amplifier, the first combined optical signal;

passing all wavelengths of the first combined optical signal, including the first pump light, through the second optical filter in the first propagation direction over the gain medium, the second optical filter reflecting second wavelengths above a second threshold wavelength received by the second optical filter over the gain medium in a direction opposite the first propagation direction, the second threshold wavelength being lower than the first threshold wavelength;

generating a second pump light at the second Raman pump using a second Fabry Perot laser;

tuning, using a second temperature controller, the second Fabry Perot laser to shift a wavelength at which the second pump light is centered toward a wavelength lower than the second threshold wavelength;

injecting the second pump light from the second Raman pump onto the gain medium for transmission in the first propagation direction; and outputting a second combined optical signal including all wavelengths of the first combined optical signal and the second pump light.

10. The method of claim 9, further comprising, at each of one or more additional stages of the amplifier:

receiving, at the additional stage of the amplifier from a previous stage of the amplifier over the gain medium, a combined optical signal output by the previous stage of the amplifier, the received combined optical signal including all wavelengths passed through a respective optical filter at the previous stage of the amplifier and a pump light injected onto the gain medium by a respective Raman pump at the previous stage of the amplifier;

passing all wavelengths of the received combined optical signal through a respective optical filter in the first propagation direction over the gain medium and reflecting respective wavelengths above a respective threshold wavelength received by the respective optical filter over the gain medium in a direction opposite the first propagation direction, the respective threshold wavelength being lower than a respective threshold wavelength of a respective optical filter at the previous stage of the amplifier;

injecting a respective pump light from a respective Raman pump onto the gain medium for transmission in the first propagation direction, the respective pump light being centered at a wavelength lower than the respective threshold wavelength; and outputting a respective combined optical signal including all wavelengths of the received combined signal and the respective pump light.

11. The method of claim 9, further comprising:

applying a first tuning current to the first Raman pump to shift the wavelength at which the first pump light is centered toward the wavelength lower than the first threshold wavelength; and applying a second tuning current to the second Raman pump to shift the wavelength at which the second pump light is centered toward the wavelength lower than the second threshold wavelength.

12. The method of claim 9, wherein the input optical signal is a wavelength division multiplexed (WDM) signal.

13. An optical system for low-noise amplification of optical signals, comprising:

a transmitter configured to transmit an input optical signal; and a low-noise Raman amplifier, comprising:
a gain medium; and
a plurality of amplifier stages, including:
a first amplifier stage configured to receive the input optical signal and to output a first combined optical signal, the first amplifier stage comprising:
a first optical filter configured to pass all wavelengths of the input optical signal through the first optical filter in a first propagation direction over the gain medium and to reflect first wavelengths above a first threshold wavelength received by the first optical filter over the gain medium in a direction opposite the first propagation direction; and
a first Raman pump configured to inject a first pump light onto the gain medium for transmission in the first propagation direction, the first pump light being centered at a wavelength lower than the first threshold wavelength, the first Raman pump comprising a first Fabry Perot laser configured to generate the first pump light, and comprising a first temperature controller configured to tune the first Fabry Perot laser to shift the wavelength at which the first pump light is centered toward the wavelength lower than the first threshold wavelength; and
one or more additional amplifier stages, each additional amplifier stage being configured to receive a combined optical signal from a previous amplifier stage and to output a respective combined optical signal, and each additional amplifier stage comprising:
a respective optical filter configured to pass all wavelengths of the received combined optical signal through the respective optical filter in the first propagation direction over the gain medium and to reflect respective wavelengths above a respective threshold wavelength received by the respective optical filter over the gain medium in a direction opposite the first propagation direction, the respective threshold wavelength being lower than a threshold wavelength at the previous amplifier stage; and
a respective Raman pump configured to inject a respective pump light onto the gain medium for transmission in the first propagation direction, the respective pump light being centered at a wavelength lower than the respective threshold wavelength, the respective Raman pump at each of the additional amplifier stages comprising a respective Fabry Perot laser configured to generate the respective pump light, and comprising a respective temperature controller configured to tune the respective Fabry Perot laser to shift the wavelength at which the respective pump light is centered toward the wavelength lower than the respective threshold wavelength;

wherein the first combined optical signal includes all wavelengths of the input optical signal and the first pump light and, for each of the additional amplifier stages, the respective combined optical signal output by the additional amplifier stage includes all wavelengths of the received combined signal and the respective pump light.

14. The optical system of claim 13, wherein the input optical signal is a wavelength division multiplexed (WDM) signal.

* * * * *